United States Patent
Leibovitz et al.

Patent Number: 5,268,048
Date of Patent: Dec. 7, 1993

[54] REWORKABLE DIE ATTACHMENT

[75] Inventors: Jacques Leibovitz, San Jose, Calif.; Hilmar W. Spieth, Calw-Heumaden, Fed. Rep. of Germany; Peter F. Dawson, Portola Valley; Voddarahalli K. Nagesh, Cupertino, both of Calif.

[73] Assignee: Hewlett-Packard Company, Palo Alto, Calif.

[21] Appl. No.: 988,638

[22] Filed: Dec. 10, 1992

[51] Int. Cl.$^5$ .................. B32B 35/00; H01L 21/58
[52] U.S. Cl. ............................... 156/94; 156/297; 29/831; 437/205; 437/209; 437/923
[58] Field of Search ............. 156/94, 98, 297, 307.3, 156/307.5, 310; 29/829, 830, 831, 832, 402.03; 257/707, 777; 437/205, 209, 211, 212, 923; 428/901

[56] References Cited

U.S. PATENT DOCUMENTS

| | | | |
|---|---|---|---|
| 4,012,832 | 3/1977 | Crane | 437/209 |
| 5,137,836 | 8/1992 | Lam | 437/923 |
| 5,220,724 | 6/1993 | Gerstner | 29/832 |

FOREIGN PATENT DOCUMENTS

| | | | |
|---|---|---|---|
| 0051165 | 5/1982 | European Pat. Off. | 29/831 |
| 59-44834 | 3/1984 | Japan | 437/209 |

OTHER PUBLICATIONS

Dunkel, W. E. IBM Technical Disclosure Bulletin "Replaceable Chip to Heat Sink Connection on Circuit Boards" vol. 14, No. 11 Apr. 1972.

*Primary Examiner*—Michael W. Ball
*Assistant Examiner*—Robert W. Robey

[57] ABSTRACT

An integrated circuit is reworkably attached to a circuit board in a manner that forms a compliant bond which is stable under conditions of high thermal stress and thermal coefficient of expansion mismatch. A thermoplastic adhesive having a melting temperature higher than integrated circuit operating temperature is coated on the integrated circuit and dried. The adhesive is then cured. The coated integrated circuit is bonded to the circuit board with a thermosetting epoxy having a low curing temperature, such that curing the adhesive does not damage the circuit board. The integrated circuit is readily removed from the circuit board without damaging the board by heating the integrated circuit to soften the bond between the integrated circuit and the circuit board at the thermoplastic adhesive interface. An alternate embodiment of the invention provides a copper plate interface that is soldered to the circuit board, and to which an integrated circuit is permanently bonded. Reworkability is achieved by flowing the solder bond and removing the copper plate/integrated circuit assembly.

2 Claims, 1 Drawing Sheet

5,268,048

REWORKABLE DIE ATTACHMENT

BACKGROUND OF THE INVENTION

1. Technical Field

The present invention relates to electronic assemblies. More particularly, the present invention relates to reworkably attaching integrated circuits and related devices to a substrate.

2. Description of the Prior Art

Semiconductor technology has advanced to the point where a designer has many options to choose from when mounting an integrated circuit die as part of an electronic assembly. For example, it is common practice to mount integrated circuit die directly to various substrates, such as packaging, circuit boards, flexible films, etc.

Circuit boards are presently the predominant means of forming electronic assemblies with integrated circuits and related components. One advantage of a circuit board is that, in addition to providing a substrate to which the integrated circuit may be mechanically attached, for example by an adhesive, circuit boards also provide electrical interconnection between the terminals of the integrated circuit and other electronic components in the electronic assembly. Various techniques are known for making electrical connections between the terminals of the integrated circuit and those of the circuit board, e.g. ball bonding, bumping, wire bonding, etc.

It is desirable, and often necessary, to remove defective or obsolete integrated circuits from such electronic assemblies, such that the assemblies may be reworked. In this way, an expensive circuit board containing many integrated circuits and other components may be repaired and reused, rather than being discarded. It is also desirable to remove integrated circuits from circuit boards for salvage purposes. For example, it is often useful to remove an expensive microprocessor from a circuit board for use elsewhere, or where the board is irreparably damaged.

Most adhesives that are commonly used to attach a die to a circuit board form a permanent bond between the integrated circuit and the circuit board. When these adhesives cure, an irreversible polymerization occurs. Once bonded to a circuit board in this way, a die may not be removed from the circuit board without destroying the die and damaging the board, along with other electronic components mounted on the board.

It is known that thermoplastic adhesives provide a bonding material that may be softened with heat and thereby reworked. However, the selection of softening and curing temperatures for such adhesives is quite limited. Thermoplastic adhesives that may be cured and softened at temperatures low enough to avoid damaging common circuit boards, such as are made of FR4 material having a low glass transition temperature ("Tg"), and neighboring electronic components during attachment or rework do not maintain a satisfactory bond under normal circuit operating conditions. Thus, a thermoplastic bond will fail when the bond is subjected to significant thermal stress, such as is typically found in a powered integrated circuit. Additionally, the likelihood of bond failure due to thermal stress is exacerbated by the temperature coefficient of expansion (TCE) mismatch between the silicon integrated circuit, about 2.3 cm/cm-° C., and the circuit board material, about 17 cm/cm-° C.

Thus, adhesives that provide a reworkable, stable bond for attaching an integrated circuit die to a common circuit board are not known. A process for reworkably attaching a die to a circuit board would provide more efficient electronic module production by eliminating the waste of otherwise repairable circuit boards and other components.

SUMMARY OF THE INVENTION

The present invention provides a strong, highly compliant, reworkable bond for attaching an integrated circuit die to a common circuit board. The bond provided by the present invention is stable under conditions of high thermal stress, and is especially suited for materials having differing thermal properties, for example materials of low Tg and/or where a high thermal coefficient of expansion mismatch is experienced.

In the preferred embodiment of the invention, a thermoplastic adhesive is applied to an integrated circuit. The adhesive is then dried and cured. After coating with thermoplastic adhesive, the integrated circuit is adhered to a printed circuit board with a high compliance, thermosetting epoxy adhesive having a low curing temperature.

The thermoplastic adhesive is selected from those adhesives having the lowest possible curing temperature, but a sufficiently high curing temperature, such that a stable bond is maintained at temperatures experienced when an integrated circuit is powered and operating. The thermosetting epoxy is selected for its low curing temperature, such that curing of the adhesive does not damage the low Tg printed circuit board.

During rework, intense heat is applied to the integrated circuit, and first flows to the thermoplastic adhesive, thereby softening the adhesive. The softening of the adhesive bond allows the detachment of the integrated circuit from the circuit board, which immediately stops heat flow through the integrated circuit to the circuit board, and prevents damage to the printed circuit board.

An alternate embodiment of the invention provides a copper plate to which an integrated circuit is bonded with a thermosetting adhesive. The copper plate/integrated circuit assembly is then soldered to a printed circuit board by any of the known methods, including surface mount technology.

DETAILED DESCRIPTION OF THE INVENTION

Figure 1:
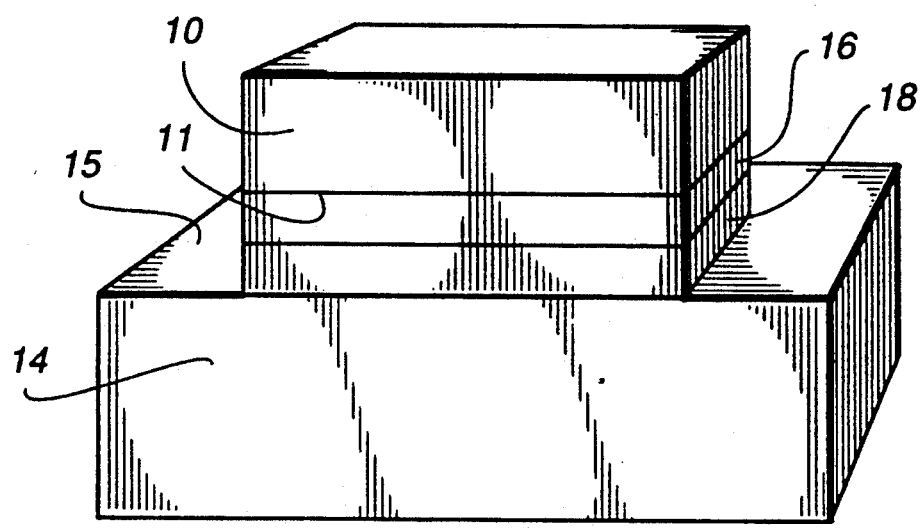
FIG. 1 is a schematic perspective representation of an integrated circuit/circuit board bond formed according to the present invention.

The present invention is best understood by referring to the Drawings in connection with review of this Description. The present invention provides a highly compliant, stable, reworkable bond, exhibiting excellent mediation of thermal properties between silicon and various substrate materials, including materials having a low Tg and/or large coefficient of expansion mismatch.

FIG. 1 is a schematic perspective view of an integrated circuit 10 that has been bonded to a printed circuit board 14 in accordance with the present invention. The present invention provides a composite bond 16/18 in which a layer of thermosetting adhesive 18 is included to provide high compliance under conditions of thermal stress and thermal coefficient of expansion mismatch, and more importantly, which cures at a temperature low enough so as not to damage the printed circuit board; and in which a layer of thermoplastic adhesive 16 is included to provide a reworkable bond, such that the integrated circuit 10 may be readily removed from the printed circuit 14 by the application of heat.

The present invention as described herein is directed to bonding a component, such as a silicon integrated circuit to a printed circuit board. It will be appreciated by those skilled in the art that the present invention is readily applicable to other component compositions, for example GaAs, etc. integrated circuits, modules, etc., as well as leadless chip carriers, and various circuit board compositions, for example ceramics, silicon, glass, glass-/ceramic, FR4, etc.

In one embodiment of the invention, a thermoplastic adhesive, such as Staystik 181 TM manufactured by Staystik, Inc. of Santa Ana, Calif., is applied to a bond surface 11 of an integrated circuit 10. The adhesive is dried and cured. Curing typically is accomplished by heating the adhesive to 220° C. for about 30 minutes. Such adhesive may not be used with printed circuit boards having a low Tg, such as FR4, because the amount of heat required to cure the adhesive would ruin the board.

After the thermoplastic adhesive has cured, the coated surface of the integrated circuit 10 is bonded to a bond surface 15 of the printed circuit board 14 with a thermosetting adhesive having a low curing temperature, such as Ablebond TM 84-1A, manufactured by Ablestik Laboratories of Rancho Dominguez, Calif. The low curing temperature of the thermosetting adhesive is consistent with the low Tg of common circuit board materials and any thermosetting adhesive exhibiting this quality may be substituted for the exemplary adhesive without departing from the spirit and scope of the present invention.

The composite bond thus formed between the integrated circuit and the circuit board may be readily reworked, e.g. to replace a defective integrated circuit, or to salvage a valuable integrated circuit for use elsewhere. Such reworkability is particularly important in most modern applications where a printed circuit board typically contains dozens of valuable components. The ability to remove and replace a defective component, as provided by the present invention, assures that functioning devices and otherwise serviceable circuit boards are not discarded. Thus, product manufacturing costs are significantly reduced.

For rework, the integrated circuit is heated, thereby softening the thermoplastic adhesive (which typically softens at about 180° C. after 1-5 minutes of heating). The softening of the adhesive bond allows the integrated circuit to be removed from the printed circuit board. Removing the integrated circuit immediately stops the flow of heat to the circuit board and thereby prevents damage to the printed circuit board. That is, the adhesive bond begins to soften before sufficient heat is transferred to the printed circuit board to damage the board. It is therefore beneficial to remove the integrated circuit from the printed circuit board quickly and thereby limit circuit board exposure to heat.

After a defective integrated circuit is removed from a printed circuit board, a replacement integrated circuit may be attached to the printed circuit by the same technique. That is, a thermoplastic adhesive is applied to the replacement integrated circuit, the adhesive is dried and cured, and the coated surface of the integrated circuit is bonded to the printed circuit board with a thermosetting adhesive. As the original thermosetting layer remains on the surface of the printed circuit, it is necessary to bond the replacement integrated circuit to the printed circuit with an additional thermosetting adhesive layer.

An alternate embodiment of the invention provides an interface substrate, such as a copper plate to which the integrated circuit is bonded with a thermosetting adhesive which provides mediation of TCE mismatch. The assembly thus formed is bonded to the circuit board with solder by any of the known techniques currently used in industry.

Thus, two structural bond configurations are provided by the present invention: circuit board/thermosetting adhesive/thermoplastic adhesive/Si; and circuit board/solder/Cu/thermosetting adhesive/Si.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

We claim:

1. A method for forming a releasable, compliant bond between a component and a substrate, comprising the steps of:

coating a bond surface of said component with a thermoplastic adhesive;

drying said thermoplastic adhesive;

curing said thermoplastic adhesive;

adhering said component to said substrate by coating at least one of said component bond surface and a substrate bond surface with a thermosetting adhesive and, thereafter, bringing said component bond surface and said substrate bond surface together; and curing said thermosetting adhesive.

2. The method of claim 1, further comprising the step of:

releasing said component from said substrate by applying sufficient heat to said component to soften said thermoplastic adhesive rapidly; and detaching said component from said substrate before damaging said substrate.

* * * * *